United States Patent [19]
Lee

[11] 3,990,025
[45] Nov. 2, 1976

[54] NETWORK WITH A SINGLE AMPLIFIER FOR SIMULATING AN FDNR CIRCUIT

[75] Inventor: Man Shek Lee, Belmont, Calif.

[73] Assignee: GTE Automatic Electric Laboratories Incorporated, Northlake, Ill.

[22] Filed: Dec. 24, 1975

[21] Appl. No.: 644,280

[52] U.S. Cl. .............................. 333/80 R; 333/80 T
[51] Int. Cl.² .......................................... H03H 7/44
[58] Field of Search ......................... 333/80 R, 80 T

[56] References Cited
UNITED STATES PATENTS

| | | | |
|---|---|---|---|
| 2,968,773 | 1/1961 | Sandberg | 333/80 T |
| 3,219,952 | 11/1965 | Saraga | 333/80 R |
| 3,831,117 | 8/1974 | Fletcher | 333/80 R |
| 3,895,309 | 7/1975 | Rollett et al. | 333/80 R |

*Primary Examiner*—Harold A. Dixon
*Attorney, Agent, or Firm*—Russell A. Cannon; Leonard R. Cool

[57] ABSTRACT

The one-port network here includes a pair of terminals having a resistor R7 electrically connected therebetween, and a differential-input operational amplifier having an output electrically connected through a resistor R3 to a first input of the amplifier and through a resistor R4 to a second input of the amplifier. The first input of the amplifier is connected through a capacitor C5 to one terminal of the network which is electrically connected to a ground reference potential. The second input of the amplifier is also connected to ground through a resistor R6. The first and second inputs of the amplifier are electrically connected through resistor R1 and capacitor C2, respectively, to the other terminal of the network. With the initial constraint that the value of the conductance of the resistor R4 be equal to the product of the capacitance of the capacitor C2 and the conductance of the resistor R3 divided by the capacitance of the capacitor C5, the network simulates the parallel combination of an FDNR, a capacitor, and a resistor across the terminals thereof. Particular other additional relations between values of network elements cause the simulated capacitance and/or the simulated resistance to vanish in order to simulate an FDNR singularly.

10 Claims, 2 Drawing Figures

NETWORK WITH A SINGLE AMPLIFIER FOR SIMULATING AN FDNR CIRCUIT

BACKGROUND OF INVENTION

This invention relates to simulation networks and more particularly to a network for simulating a frequency-dependent negative resistor (FDNR) alone or in parallel with a capacitor and/or a resistor.

In order to provide high-quality filters for use in integrated circuit applications, simulation networks are employed to replace filter inductors with other elements that can be fabricated with integrated circuit techniques. One method of realizing a lowpass filter network is to use the concept of frequency-dependent negative resistors (FDNR), which are designated by the parameter D and a symbol represented by four parallel lines. An FDNR is a circuit element defined by its admittance Y which satisfies the relationship $Y(s) = s^2 D$, where s is the complex frequency parameter and D is a real constant which may be positive or negative. A prior-art lowpass ladder filter comprises a pair of series inductors connected in series between input and output terminals, an inductor in series with a capacitor and connected between the junction of the series inductors and a ground reference potential, an output capacitor connected between the output terminal and ground, and input and output resistors connected between the input and output terminals, respectively, and ground. The voltage transfer function of this filter is unchanged if the filter is transformed to another network by multiplying the admittance of every element by the complex frequency parameter s, so that an inductor becomes a resistor, a resistor becomes a capacitor, and a capacitor becomes an FDNR in the transformed network in accordance with the technique described in the article, "Network Transfer Functions Using the Concept of Frequency-Dependent Negative Resistance" by L. T. Bruton, IEEE Transactions on Circuit Theory, August 1969, pp. 406 - 408. The resultant network includes an FDNR, the series combination of an FDNR and a resistor, and the parallel combination of an FDNR and a capacitor. Prior-art circuits for simulating an FDNR singularly or in combination with other elements are relatively complex and generally employ two or more amplifiers. Although the structure disclosed in the article, "Parallel Resonator With a Resistance and a Frequency-Dependent Negative Resistance Realized with a Single Operational Amplifier" by Francesco Molo, IEEE Transactions on Circuits and Systems, vol. CAS-21, no. 6, November 1974, pp. 783 - 788, employs only one amplifier, the FDNR simulated there has a finite Q in that the admittance of the network cannot be adjusted to zero at a particular frequency. Also, the circuit in this article does not simulate an FDNR alone, and it requires three capacitors in the simulation network as opposed to the usual two capacitors.

An object of this invention is the provision of an improved circuit for realizing an FDNR singularly or in parallel with a resistor and/or a capacitor.

DESCRIPTION OF DRAWING

This invention will be more fully understood from the following detailed descriptions of preferred embodiments thereof, reference being had to the drawing in which.

DESCRIPTION OF PREFERRED EMBODIMENTS

Figure 1:
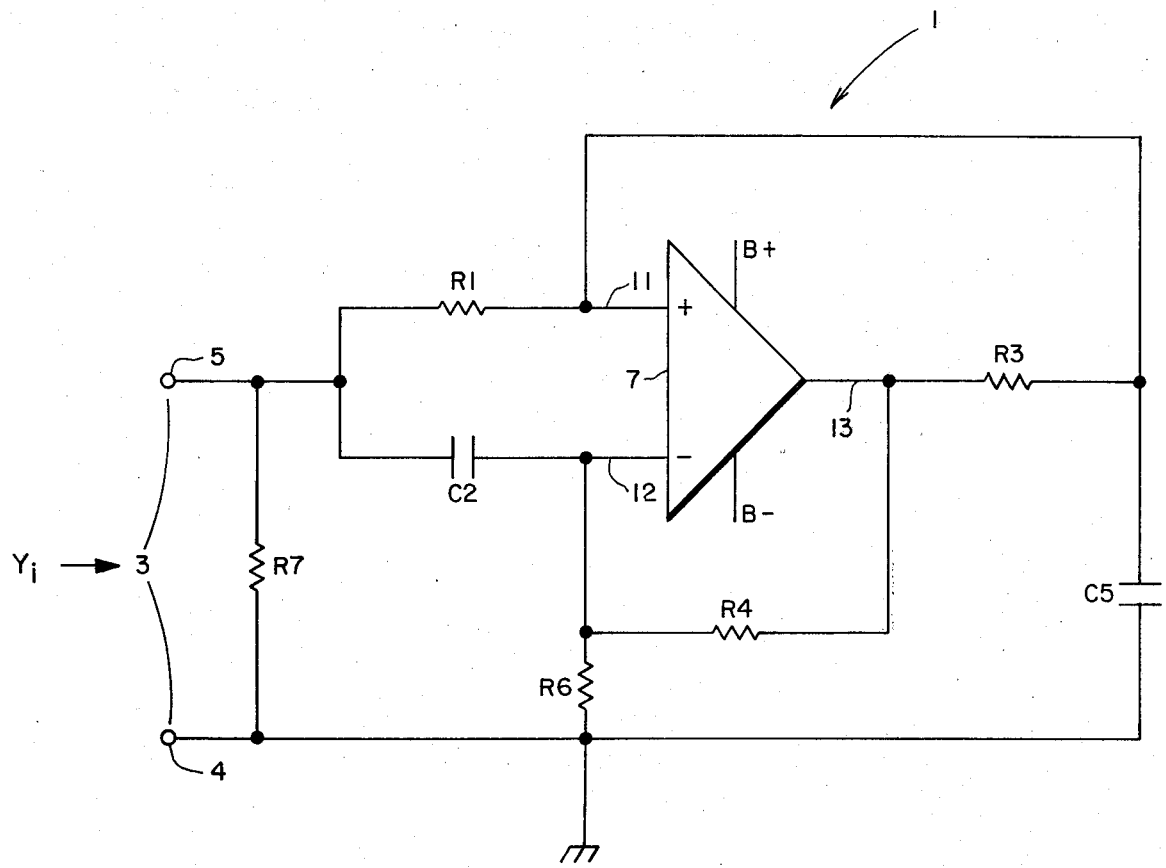
FIG. 1 is a schematic circuit diagram of a simulation network embodying this invention.

The network 1 in FIG. 1 comprises a single port 3 including a pair of terminals 4 and 5, a single amplifier 7, a pair of capacitors C2 and C5, and a plurality of resistors. The same reference characters (e.g., C5) are employed in this description to designate both the element and the element value (e.g., the capacitance thereof). The context in which a reference character is employed clearly indicates what it designates.

The amplifier 7 is a differential-input operational amplifier. This amplifier 7 is considered in the following description to be an ideal amplifier with zero output impedance, infinite input impedance, and infinite voltage gain. Although such an ideal amplifier does not exist in practice, this does not seriously affect the operation of the network 1. A non-ideal amplifier 7 merely introduces extraneous terms in the admittance $Y_i$ that is simulated across the network terminals 4 and 5 which may be compensated for, in a manner well known in the art, in order to produce the desired admittance across port 3.

One of the network terminals 4 is connected to a ground reference potential. The other network terminal 5 is connected through a resistor R1 and the capacitor C2 to the input lines 11 and 12, respectively, of amplifier 7. The lines 11 and 12 are preferably connected to the positive and negative inputs, respectively, of amplifier 7. These connections may be reversed in most instances, however, and the network will still operate satisfactorily. The actual polarity of the amplifier connections is selected to ensure that the network is DC stable. This is accomplished by making the negative feedback here greater than the positive feedback in a manner well known in the art. This connection may also be affected by whatever resistance path is connected across the terminals 4 and 5. Terminals of the amplifier are also connected to a supply voltage in a manner well known in the art. The output line 13 of the amplifier is connected through a resistor R3 to one input line 11, through a resistor R4 to the other input line 12, and through the series combination of the resistor R3 and the capacitor C5 to ground. The input line 12 of the amplifier is also connected to ground through a resistor R6. A resistor R7 is connected across the network terminals 4 and 5.

Elementary network analysis for this network in FIG. 1 gives, for an ideal amplifier, an admittance $Y_i$ looking into port 3 of $$Y_i = g7 + \frac{(sC2 + g1)(sC5\,g4 - g3\,g6)}{(g1 + sC5)\,g4 - (g6 + sC2)g3}. \tag{1}$$

Requiring that values of elements here satisfy the relationship $$g4/g3 = C2/C5 \neq 0, \tag{2}$$

where g represents the conductance of a particular resistor, the admittance $Y_i$ looking into port 3 is representable as $$Y_i = s^2 D + sC + G$$
$$= s^2 \left( \frac{g4\,C2\,C5}{g1\,g4 - g3\,g6} \right) + s \left( \frac{g1\,g4\,C5 - g3\,g6\,C2}{g1\,g4 - g3\,g6} \right) +$$
$$\left( g7 - \frac{g1\,g3\,g6}{g1\,g4 - g3\,g6} \right). \tag{3}$$

Figure 2:
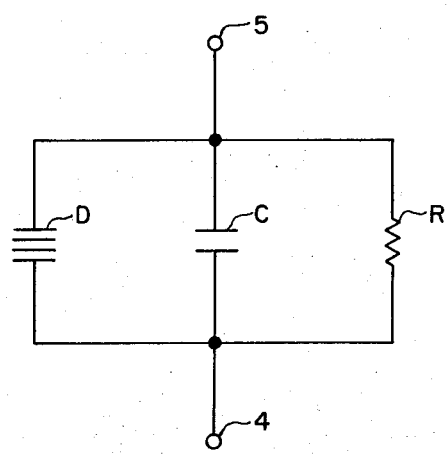
FIG. 2 is a schematic representation of the circuit elements simulated by the network in FIG. 1 across the one port thereof.

This admittance $Y_i$ is shown in FIG. 2 and corresponds to the parallel combination of an FDNR D, a capacitor C, and a resistor R (where $R = 1/G$) between the network terminals 4 and 5. On defining $\alpha = C2/C5 = g4/g3$; $\beta = g6/g1$; and $\gamma = 1/(\alpha - \beta)$, these simulated elements are also representable, after simplification, as $$D = \frac{\gamma C2^2}{g1} = C2/((g1/C5) - (g6/C2)) \quad (4)$$

$$C = \gamma(1 - \beta)C2 = (g1 - g6)/((g1/C5) - (g6/C2)) \quad (5)$$

and $$G = g7 - \gamma\beta g1 = g7 - (g1\ g6/C2)/((g1/C5) - (g6/C2)) \quad (6)$$

By proper selection of the values of network elements, individual or combinations of the elements D, C, and R may be simulated across port 3. The value of the simulated FDNR D may be positive or negative. If the value of D is positive, the conductance G of the simulated element R may be positive or negative, or zero such that it is effectively removed from the circuit. In contrast, if the value of D is negative, the simulated conductance G is positive In either case, the value of C may be positive, negative or zero.

In order to simulate the parallel combinaton of a particular resistor, capacitor, and FDNR across port 3, the values of network elements are selected to satisfy the requirement in equation (2) and the above relations in equations (3) – (6) defining the simulated FDNR D, capacitor C, and resistor $R = 1/G$. In practice, desired values of the simulated elements are selected. Normalized values of the resistance and capacitance of network elements are also selected so as to satisfy the requirement of equation (2) and the relationships in equations (3) - (6) for these previously selected values for D, C, and R. Finally, the normalized values of the network elements are de-normalized to values for the corresponding elements which are physically realizable in an actual network. Such a combination of simulated elements is particularly useful at the termination of bandpass filters. By way of example, the parallel combination of a resistor $R = 1/G$, capacitor C, and FDNR D satisfying equations (3) – (6) is simulated across port 3 if the element values satisfy the definitions:

$$C2 = g4 = g6 = 1; C5 = g3 = (D + C)/(1 + D); g1 = 1 + (C/D); g7 = G + D + C. \quad (7)$$

In an alternate embodiment of the invention, the element values of network elements are further required to satisfy the relationship $$g7 = \beta\gamma g1 = \frac{g1\ g3\ g6}{g1\ g4 - g3\ g6} \quad (8)$$

such that the expression for G in equations (3) and (6) goes to zero. The resultant admittance indicates that the new network now simulates the parallel combination of an FDNR D and a capacitor C (still defined by equations (4) and (5), respectively) across port 3. Such a combinaton of simulated elements is particularly useful at one end of an FDNR lowpass filter of even degree and at the termination of many bandpass filters. By way of example, one possible set of element values for simulating the parallel combinaton of a capacitor C and an FDNR D across port 3 is:

$$C2 = g4 = g6 = 1; C5 = g3 = (D + C)/(1 + D); g1 = 1 + (C/D); g7 = D + C \quad (9)$$

In another alternate embodiment of this invention, the element values in FIG. 1 are required to satisfy equation (2) and the additional requirements that $$\beta = 1 \text{ and } \alpha \neq 1, g1 = g6 \text{ and } C2 \neq C5 \quad (10)$$

such that the expression for C in equations (3) and (5) goes to zero. The resultant admittance indicates that the new network which satisfies the requirements of equations (2) and (10) now simulates the parallel combination of an FDNR D and a resistor $R = 1/G$ (still defined by equations (4) and (6), respectively) across port 3. By way of example, one set of element values for simulating the parallel combination of an FDNR D and a resistor $R = 1/G$ across port 3 is $$C2 = g1 = g4 = g6 = 1; C5 = g3 = D/(1 + D); g7 = D. \quad (11)$$

This network structure may be made to simulate an FDNR alone by additionally requiring that the element values also satisfy equation (8) to make both C and G vanish in equation (3). The value of the FDNR alone is still defined by equations (3) and (4). The admittance $Y_i$ then becomes $$Y_i = s^2 D = s^2\ \frac{\gamma C2^2}{g1} = s^2\ \frac{C2^2}{g1}\left(\frac{1}{(C2/C5) - 1}\right) \quad (12)$$

since equation (10) specifies that $\beta = g6/g1 = 1$. If the resistance R1 is positive and $C2 > C5$, the value of D alone here is positive. By way of example, one possible set of element values for simulating an FDNR D alone across port 3 is $$C2 = 1; C5 = 1/2; g4 = 2/D; g1 = g3 = g6 = g7 = 1/D. \quad (13)$$

Alternatively, this network structure satisfying equations (2) and (10) may be made to simulate the parallel combination of an FDNR and a resistor having a frequency-independent negative resistance by requiring that element values satisfy equations (2) and (10), and that $$g7 < \gamma\beta\ g1 = \gamma g1 = \frac{g1\ C5}{C2 - C5} = \frac{g1\ g3\ g6}{g1\ g4 - g3\ g6} \quad (14)$$

since equation (10) specifies that B =1.

In a network that was built and which operated satisfactorily for its intended purpose of simulating an FDNR alone, the element values were as follows:

R1 4822 ohms
R3 4822 ohms
R4 2411 ohms
R6 4822 ohms
R7 4822 ohms
C2 10 nanofarads
C5 5 nanofarads
D $2.411 \times 10^{-13}$ farad-farad-ohms.

In this network, the differential-input operational amplifier was a model μA741, manufactured by Raytheon Semiconductor Corporation.

What is claimed is:

1. An active, one-port network for simulating the parallel combination of an FDNR D, a capacitor C, and a resistor $R = 1/G$ electrically connected across the pair of terminals of the network port, comprising:
   a differential-input operational amplifier having first and second input lines electrically connected to associated input terminals of the amplifier which are of opposite polarity and having an output line;
   a resistor R1 electrically connected between one network terminal and said first input line;
   a capacitor C2 electrically connected between the one terminal and said second input line;
   a resistor R3 electrically connected between said output line and said first input line;
   a resistor R4 electrically connected between said output line and said second input line;
   a capacitor C5 electrically connected between said first input line and the other network terminal which is also connected to a ground reference potential;
   a resistor R6 electrically connected between said second line and ground; and
   a resistor R7 electrically connected between the one and other network terminals;
   normalized values of the capacitance of said capacitors and the resistance of said resistors and said simulated elements satisfying the requirements that $$g4/g3 = C2/C5 \neq 0,$$

where $g$ represents the conductance of a particular one of said resistors, the admittance $Y_i$ looking into the network port satisfies the relationships $$Y_i = s^2 D + sC + G,$$
$$D = \gamma C2^2/g1,$$
$$C = \gamma(1 - \beta)C2,$$
$$G = g7 - \gamma\beta g1$$

and where $\alpha = C2/C5$, $\beta = g6/g1$, and $\gamma = 1/(\alpha - \beta)$.

2. The simulation network according to claim 1 including only a single amplifier.

3. The simulation network according to claim 2 wherein the values of said resistors and capacitors satisfy the additional requirements that $$g7 = \frac{g1\ g3\ g6}{g1\ g4 - g3\ g6} = \beta\gamma g1,$$

the admittance $Y_i$ across the network port now satisfying the relationship $$Y_i = s^2 D + sC + G$$

where $G = 0$, this latter relationship for $Y_i$ defining the parallel combination of an FDNR D and a capacitor C simulated across the network port.

4. The simulation network according to claim 3 wherein the values of said resistors and capacitors satisfy the requirements that $C2 = g4 = g6 = 1$; $C5 = g3 = (D+C)/(1+D)$; $g1 = 1 + (C/D)$; and $g7 = D + C$.

5. The simulation network according to claim 2 wherein the values of said resistors and capacitors satisfy the additional requirement that $\gamma(1 - \beta)C2 = 0$, the admittance $Y_i$ across the network port now satisfying the relationship $$Y_i = s^2 D + sC + G$$

where $C = 0$, this latter relationship for $Y_i$ defining the parallel combination of an FDNR D and a resistor $R = 1/G$ simulated across the network port.

6. The simulation network according to claim 5 wherein the values of said resistors and capacitors satisfy the requirements that $\beta = 1$ and $\gamma \neq 1$.

7. The simulation network according to claim 5 wherein the values of said resistors and capacitors satisfy the requirements that $C2 = g1 = g4 = g6 = 1$; $C5 = g3 = D/(1+D)$; and $g7 = D$.

8. The simulation network according to claim 5 wherein the values of said resistors and capacitors satisfy the requirements that $$g7 = \frac{g1\ g3\ g6}{g1\ g4 - g3\ g6} = \beta\gamma g1,$$

the network now simulating the parallel combinaton of an FDNR D and a frequency-independent negative resistor across the network port.

9. The simulation network according to claim 5 wherein the values of said resistors and capacitors satisfy the additional requirements that $$g7 < \frac{g1\ g3\ g6}{g1\ g4 - g3\ g6},$$

the value of G now being zero and the network now simulating an FDNR alone across the network port.

10. The simulation network according to claim 9 wherein the value of $D = (\gamma C2^2/g1)$ and the values of said resistors and capacitors satisfy the requirements that g1 is positive and $C2 > C5$, the value of D alone now being positive.

* * * * *

UNITED STATES PATENT OFFICE
CERTIFICATE OF CORRECTION

Patent No. 3,990,025      Dated November 2, 1976

Inventor(s) Man Shek Lee

It is certified that error appears in the above-identified patent and that said Letters Patent are hereby corrected as shown below:

Column 5, line 40, claim 1, delete the opening parenthesis in the expression for "D" here.

Column 6, Claim 8, the equation as printed should be deleted and substituted with the following equation therefore:

$$g7 < \frac{g1\ g3\ g6}{g1\ g4 - g3\ g6},$$

Column 6, Claim 9, the equation as printed should be deleted and substituted with the following equation therefore:

$$g7 = \frac{g1\ g3\ g6}{g1\ g4 - g3\ g6} = \beta\gamma g1,$$

Signed and Sealed this

Seventeenth Day of May 1977

[SEAL]

Attest:

RUTH C. MASON
*Attesting Officer*

C. MARSHALL DANN
*Commissioner of Patents and Trademarks*